United States Patent [19]
Osakabe et al.

[11] Patent Number: 5,832,989
[45] Date of Patent: Nov. 10, 1998

[54] COOLING APPARATUS USING BOILING AND CONDENSING REFRIGERANT

[75] Inventors: Hiroyuki Osakabe, Chita-gun; Kiyoshi Kawaguchi, Toyota; Masahiko Suzuki, Hoi-gun, all of Japan

[73] Assignee: Denso Corporation, Kariya, Japan

[21] Appl. No.: 811,879

[22] Filed: Mar. 5, 1997

[30] Foreign Application Priority Data

Mar. 14, 1996 [JP] Japan .................................. 8-057361
Mar. 14, 1996 [JP] Japan .................................. 8-057380

[51] Int. Cl.⁶ ...................................................... F28D 15/00
[52] U.S. Cl. ..................... 165/104.33; 165/153; 257/715; 361/700
[58] Field of Search .................. 165/104.33, 104.21, 165/153; 257/714, 715; 361/700; 62/259.2, 259.4

[56] References Cited

U.S. PATENT DOCUMENTS

| | | | |
|---|---|---|---|
| 3,989,099 | 11/1976 | Hosono et al. | 361/700 X |
| 4,023,616 | 5/1977 | Scherbaum | 165/104.33 X |
| 4,330,033 | 5/1982 | Okada et al. | 257/715 X |
| 4,705,102 | 11/1987 | Kanda et al. | 165/104.33 |
| 4,821,531 | 4/1989 | Yamauchi et al. | |
| 4,862,321 | 8/1989 | Saitoo et al. | 361/700 |
| 4,899,211 | 2/1990 | Dumoulin | 165/104.33 X |
| 5,168,919 | 12/1992 | Berenholz et al. | 165/104.33 |
| 5,479,985 | 1/1996 | Yamamoto et al. | 165/153 X |

FOREIGN PATENT DOCUMENTS

| | | | |
|---|---|---|---|
| 49418 | 4/1977 | Japan | 165/104.33 |
| 53-109249 | 9/1978 | Japan . | |
| 137087 | 10/1981 | Japan | 165/104.33 |
| 56-147457 | 11/1981 | Japan . | |
| 152150 | 9/1982 | Japan | 165/104.33 |
| 57-204156 | 12/1982 | Japan | 257/715 |
| 131755 | 8/1983 | Japan | 165/104.33 |
| 60-194289 | 10/1985 | Japan . | |
| 62-162847 | 10/1987 | Japan . | |
| 1-263491 | 10/1989 | Japan . | |
| 1-305275 | 12/1989 | Japan . | |
| 2-003320 | 1/1990 | Japan . | |
| 2-093270 | 4/1990 | Japan . | |
| 2-233993 | 9/1990 | Japan . | |
| 2-251187 | 10/1990 | Japan . | |
| 4-174294 | 6/1992 | Japan . | |
| 4-267593 | 9/1992 | Japan . | |
| 5-060476 | 3/1993 | Japan . | |
| 5-102687 | 4/1993 | Japan . | |
| 5-141811 | 6/1993 | Japan . | |
| 5190714 | 7/1993 | Japan | 257/715 |
| 5-087995 | 11/1993 | Japan . | |
| 6-012554 | 1/1994 | Japan . | |
| 7-030023 | 1/1995 | Japan . | |
| 7-039895 | 5/1995 | Japan . | |
| 7-113589 | 5/1995 | Japan . | |
| 1261029 | 9/1986 | U.S.S.R. | 257/715 |
| 2 202 681 | 9/1988 | United Kingdom . | |

Primary Examiner—Ira S. Lazarus
Assistant Examiner—Christopher Atkinson
Attorney, Agent, or Firm—Cushman Darby & Cushman IP Group of Pillsbury Madison & Sutro LLP

[57] ABSTRACT

An object of the present invention is to provide a cooling apparatus using a boiling and condensing refrigerant which can be economically manufactured. Another object is to improve reliability of soldering. A refrigerant tank, on which hot objects to be cooled is mounted, is connected to a radiator for condensing the vaporized refrigerant through a coupler made of two plates bonded together by soldering. The coupler connecting the tank and the radiator can be made easily and economically even if it has a complex shape, because the coupler is composed of two stamped plates. To bond two plates together by soldering process, it is necessary to secure an air-tightness and a high reliability. Improved configurations of the coupler and ways of fastening the two plates effectively are provided in the present invention.

20 Claims, 14 Drawing Sheets

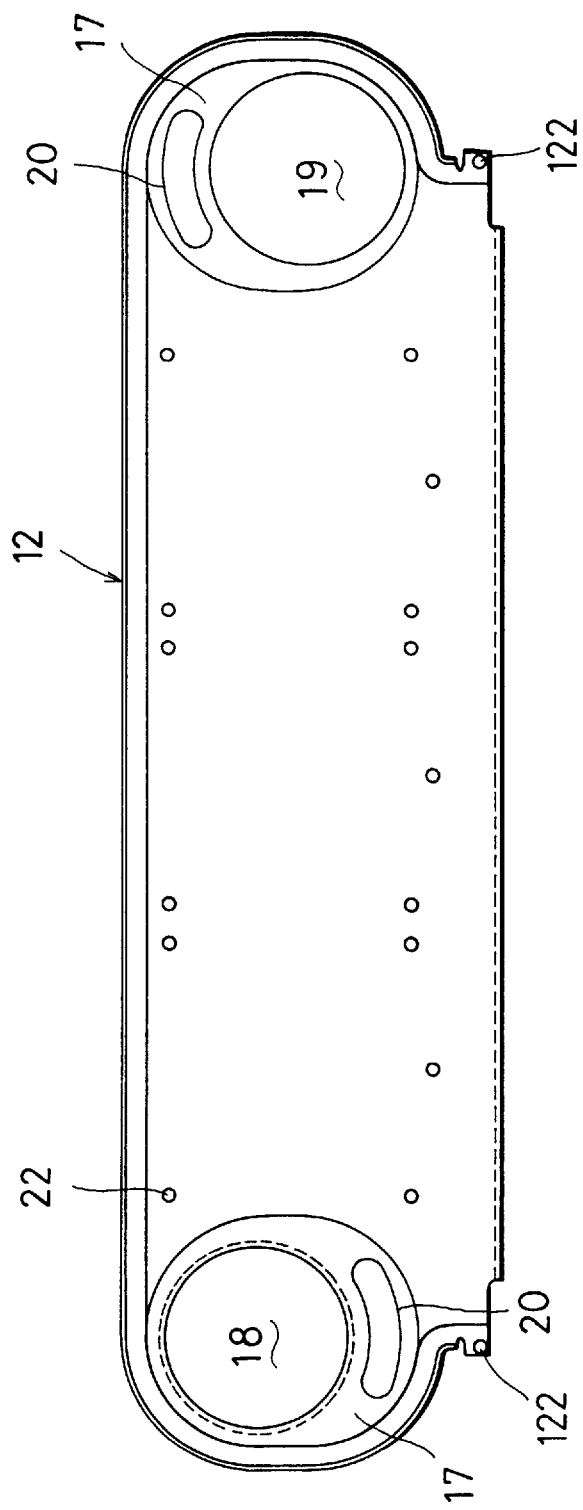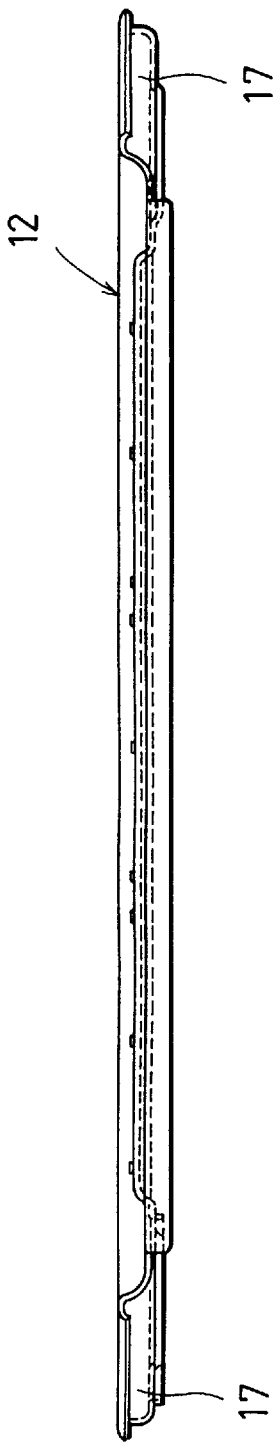
FIG. 4A
FIG. 4B

COOLING APPARATUS USING BOILING AND CONDENSING REFRIGERANT

CROSS-REFERENCE TO RELATED APPLICATIONS

This application is based upon and claims the benefit of priority of Japanese Patent Applications No. Hei-8-57380 and No. Hei-8-57361 both filed on Mar. 14, 1996, the contents of which are incorporated herein by reference.

BACKGROUND OF THE INVENTION

1. Field of the Invention

The present invention relates to a cooling apparatus using a boiling and condensing refrigerant for cooling semiconductor devices or the like.

2. Description of Related Arts

Cooling apparatus of this kind are disclosed in Japanese Patent Laid-Open Publications No. Hei-8-29041 and No. Hei-8-29042. The disclosed apparatuses are composed of a refrigerant tank, a radiator and a coupler connecting the refrigerant tank and the radiator. In these apparatuses, the radiator is connected upward on the coupler. The coupler is made in a single body which requires a complex and expensive die for making the coupler. This coupler can easily connect the refrigerant tank and the radiator in one direction, i.e., the tank downward and the radiator upward. However, it is not easy to connect the radiator perpendicular to the refrigerant tank, because making a single body coupler having openings toward two directions is difficult.

Two openings of the coupler are respectively inserted into the radiator and the refrigerant tank and bonded by soldering. The coupler as shown in Hei-8-29042 is made by deforming a plate. The process of deforming a plate into such a shape requires a big and expensive die.

SUMMARY OF THE INVENTION

The present invention has been made in view of the above-mentioned problems, and an object of the present invention is to provide an improved coupler for a cooling apparatus using a boiling and condensing refrigerant which can be made easily and economically. Another object of the present invention is to provide a coupler which can be soldered to other parts easily with a perfect air-tightness.

According to the present invention, the coupler is made by soldering two coupler plates, each of which is made by stamping a metal plate, for example, an aluminum plate. Since the aluminum plate is relatively thin, a stamping die for the plate can be made simpler and at a lower cost compared with a die for making a single body coupler. In addition, the dies for stamping the two plates can be made in a common shape at most portions thereof. Moreover, since the coupler is composed of two stamped plates, a radiator can be easily connected perpendicularly to a refrigerant tank.

The coupler is connected to the radiator to form a certain air passage according to the present invention. Therefore, heat in the coupler can be also radiated to the air passage. This means that the coupler itself also serves as a part of the radiator. Fins for radiating heat are provided in the air passage of the coupler. This also contributes to reduction of a size of the cooling apparatus.

The radiator connected to the coupler is composed of a plurality of radiator elements which are laminated on each other. Therefore, a heat radiation capacity is easily changed by increasing or decreasing the number of radiator elements laminated. Also, the radiator can be mounted on either side or both sides of the coupler, because the coupler has a plate-like shape.

Since, according to the present invention, the coupler is composed of two stamped coupler plates soldered with each other, the two plates must be connected to each other adequately before soldering process in order to secure air-tightness and reliability. Therefore, various ways for connecting two coupler plates are provided in the present invention. Also, ways for increasing a strength of a soldered portion is provided.

Other objects and features of the present invention will become more readily apparent from a better understanding of the preferred embodiment described below with reference to the following drawings.

BRIEF DESCRIPTION OF THE DRAWINGS

FIG. 4A is a plan view of a coupler plate used in the first embodiment;

FIG. 4B is a side view of a coupler plate used in the first embodiment;

DETAILED DESCRIPTION OF THE PREFERRED EMBODIMENTS

Figure 1:
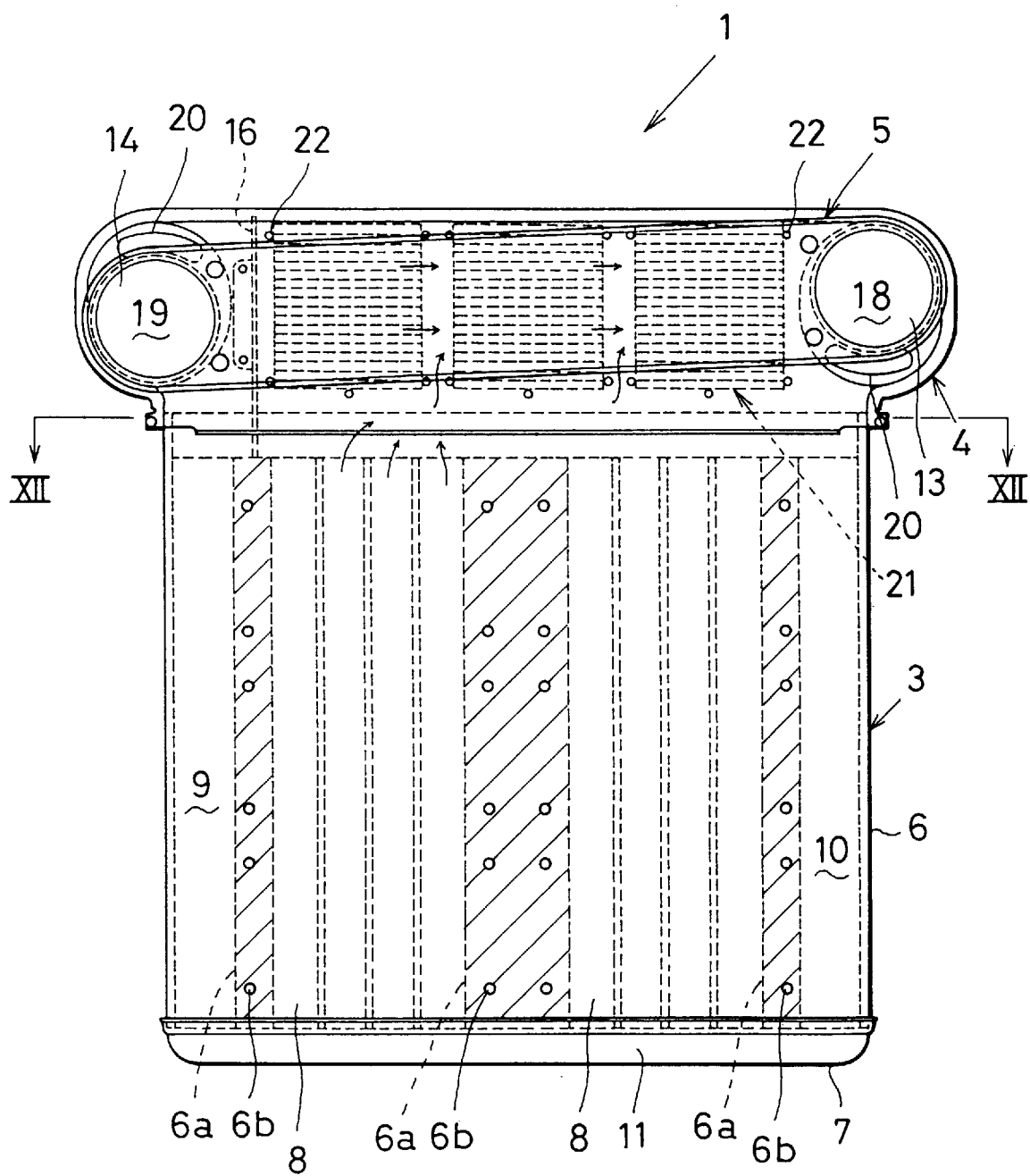
FIG. 1 is a front view of a cooling apparatus using a boiling and condensing refrigerant as a first embodiment of the present invention.

FIG. 1 shows a cooling apparatus using a boiling and condensing refrigerant for cooling hot objects 2 (shown in FIG. 2) such as semiconductor devices according to the present invention. More particularly, the hot objects may be IGBT modules used in inverter circuits for controlling electric power of, e.g., electric vehicles or other electric machines. The hot objects 2 are cooled off by heat transfer caused by boiling and condensing the refrigerant. The cooling apparatus is composed of a refrigerant tank 3, a coupler 4, a radiator 5 and a cooling fan (not shown in the drawing).

Figure 2:
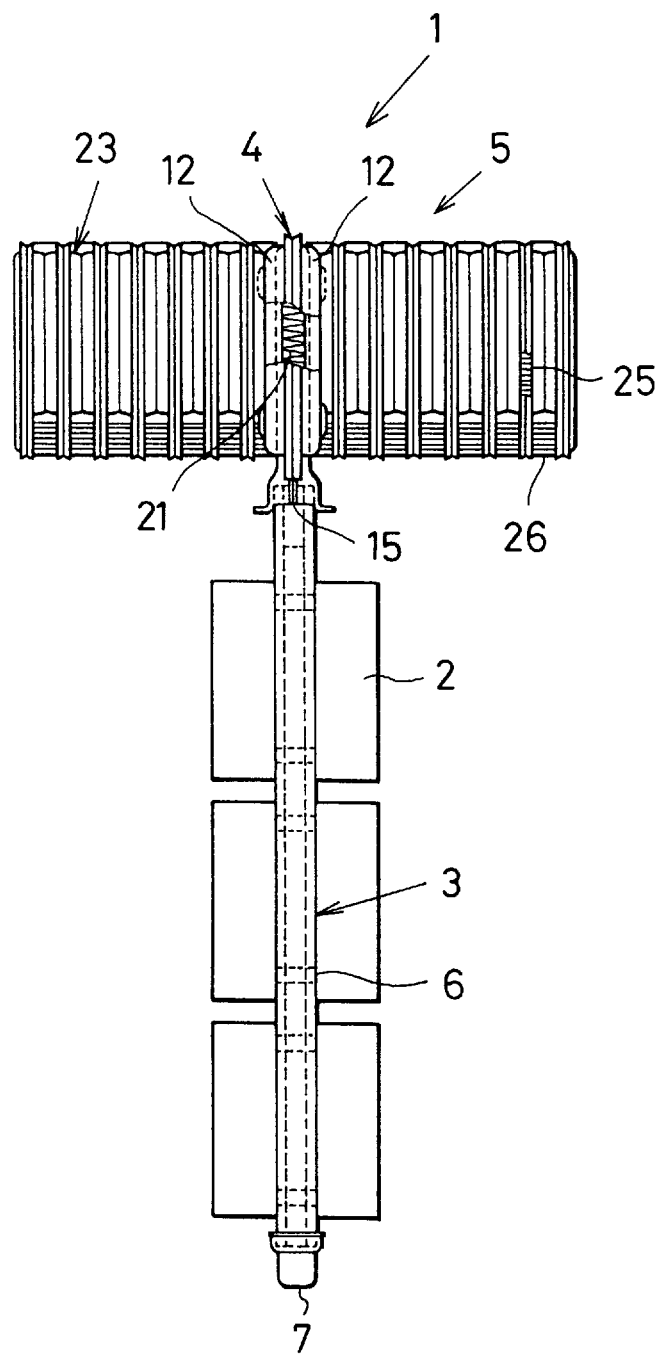
FIG. 2 is a side view of a cooling apparatus using a boiling and condensing refrigerant as the first embodiment of the present invention.

Heat dissipation plates of the hot objects are attached to an outer wall of the refrigerant tank 3 as shown in FIG. 2. The refrigerant tank 3 is composed of a case 6 made of an extruded metal such as aluminum and an end cap 7 covering a bottom end of the case. In the case 6, there are provided vapor passages 8, a liquid passage 9 and a non-operating passage 10, which are separated by section pillars 6a from one another. The refrigerant contained in the refrigerant tank 3 is boiled and vaporized by heat given from the hot objects 2, and flows upward in the vapor passages 8. Plural vapor passages 8 are provided at positions where the hot objects 2 are mounted. The refrigerant is cooled and liquidized in the radiator 5, and flows downward in the liquid passage 9 which is provided at a position apart from the position where the hot objects 2 are mounted. The non-operating passage 10 which is, not used as a liquid passage is made at a position opposite to the liquid passage 9. All the passages 8, 9 and 10 are open at an upper portion of the tank 3 because the section pillars 6a terminate at the same portion. On the section pillars 6a, there are provided screw holes 6b for mounting the hot objects 2.

The end cap 7 is made of the same material as the case 6, such as aluminum, and soldered to the case at its bottom end. A communication passage 11 is provided in the end cap 7 through which the passages 8, 9 and 10 communicate with one another. The liquid refrigerant which flows down in the liquid passage 9 continues to flow in the communication passage 11, and is distributed to each vapor passage 8.

The coupler 4 is made by soldering two coupler plates 12 shown in FIGS. 4A and 4B. The coupler plates 12 are bonded to each other by soldering at peripheries except bottom ends thereof. At both longitudinal ends of the coupler 4, there are provided a communicating portion 13 communicating to the vapor passage 8 and another communicating portion 14 communicating to the liquid passage 9, respectively. At the bottom end of the coupler 4, a connection opening 15 for connecting the coupler 4 to the refrigerant tank 3 is formed. The connection opening 15 is soldered air-tight to the refrigerant tank 3 as shown in FIG. 2. As shown in FIG. 1, the inner space of the coupler 4 is divided into two portions by a divider plate 16.

The coupler plate 12 has depressed portions 17 at both ends thereof as shown in FIGS. 4A and 4B. Holes to form passages 18 and 19 are made at the respective depressed portions 17. The depressed portions 17 on the coupler plate 12 are oval-shaped with its long axis in a vertical direction, and form the communicating portions 13 and 14 when two coupler plates 12 are bonded by soldering. The hole for the passage 18 is located at an upper side of the oval-shaped depressed portion 17 while the hole for the passage 19 is located at a lower side of the oval-shaped depressed portion 17. In other words, the passage 18 is located at a higher position than the passage 19 when the coupler 4 is assembled with the refrigerant tank 3 and the radiator 5.

Ribs 20 are formed on the depressed portion 17, one being at a lower side of the passage 18 and the other at an upper side of the passage 19. Theses ribs 20 serve strengthening the depressed portions 17.

In the inner space of the coupler 4, a plurality of inner fins 21 is inserted between the divider plate 16 and the portion 13 communicating with the vapor passage 8, as shown in FIG. 1. The inner fins 21 are supported by ribs 22 for setting the fins 21 in right positions. The fins 21 are arranged to allow the refrigerant vapor to flow toward the passage 18, and certain gaps are provided between groups of the fins so that the refrigerant vapor coming up from the vapor passages 8 can flow into the inner space of the coupler 4.

The radiator 5 is a so-called drawn cup type. A plurality of radiator elements 23 is laminated on one another. The radiator element 23 is made of two stamped plates 24 having a shape of an elongated circle (refer to FIG. 3). Two plates 24 are bonded together by soldering at peripheries thereof, forming a space therein. Each plate 24 has two holes constituting flow-in and flow-out chambers, respectively, at both longitudinal end portions thereof. The inner space of the radiator element 23 constitutes a thin refrigerant passage between the flow-in and the flow-out chambers. Wave-shaped fins 25 made of aluminum are inserted in the thin refrigerant passage (refer to FIG. 2).

Figure 3:
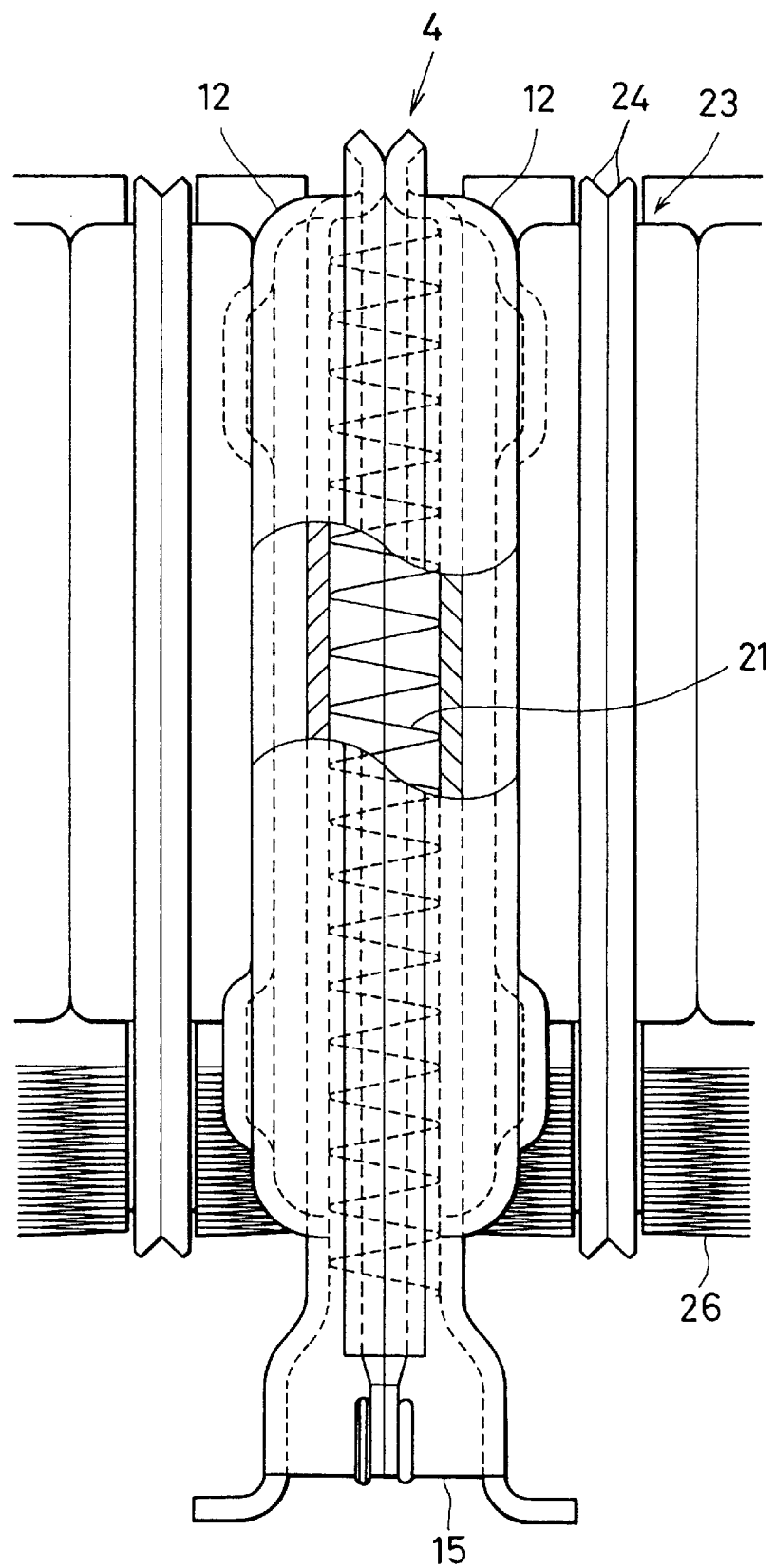
FIG. 3 is an enlarged front view showing a coupler used in the first embodiment.

As shown in FIGS. 2 and 3, a plurality of radiator elements 23 is stacked on one another on both sides of the coupler 4, and each radiator element communicates with one another through the holes constituting flow-in and flow-out chambers. Radiation efficiency of the radiator 5 is improves by mounting the radiator elements 23 on both sides of the coupler 4, compared with the case where the radiator elements 23 are mounted on one side of the coupler 4. This is because the refrigerant vapor is more uniformly distributed.

The coupler 4 and radiator 5 connected to the coupler 4 communicate with each other through the passages 18 and 19 formed on the coupler 4 and holes made on the radiator elements 23. Therefore, the radiator 5 is mounted on the coupler 4 so that the flow-in chambers of the radiator elements 23 are at a higher position than the flow-out chambers thereof (see FIG. 1). Also, as shown in FIGS. 2 and 3, radiating fins 26 are mounted in the spaces between the radiator elements 23.

A cooling fan for blowing air to the radiator 5 is located above the radiator so that an air flow direction is perpendicular to the radiator 5.

Now, operation of the cooling apparatus 1 according to the present invention will be explained below. The refrigerant is boiled and evaporated by heat received from the hot objects 2, and the vapor flows up through the vapor passages 8 and flows into the communicating portion 13 of the coupler 4. Then, the vapor flows from the communicating portion 13 to the flow-in chamber of each radiator element 23, and is distributed to the thin refrigerant passage in each radiator element 23. The refrigerant vapor flowing through the thin passage is cooled and liquidized by contacting inner walls of the thin passage and the fin 25 therein, both of which are cooled by an air flow of the cooling fan. The liquidized refrigerant flows on the bottom surface of the thin passage toward the flow-out chamber of each radiator element 23. The liquid refrigerant further flows from the flow-out chamber to the liquid passage 9 of the refrigerant tank 3 through the communicating portion 14 of the coupler 4. The liquid refrigerant flowed down in the liquid passage 9 reaches the communication passage 11 of the end cap 7, and is supplied to the vapor passages 8 again. Heat generated in the process of liquidizing the refrigerant in the radiator 5 is transferred from the walls of the radiator element 23 to the radiating fins 26, and is radiated in the air blown by the cooling fan.

Now, merits or advantages of the first embodiment of the present invention will be explained below. Since the coupler 4 is made of two stamped plates, it is easier to manufacture the coupler 4 even when it has a complex shape. The stamping dies for both coupler plates 12 are common in most parts, and accordingly the dies can be made at lower cost. Since there is provided a space between the coupler 4 and the radiator 5, cooling air can flow through the space and, therefore, the refrigerant vapor flowing through the coupler 4 can be cooled. In other words, the coupler also functions as a part of the radiator. Therefore, the radiator 5 can be made smaller. Further, the radiator 5 can be easily mounted on either side or both sides of the coupler 4, because the coupler 4 has a plate-like shape. Since the inner fins 21 are inserted between two coupler plates 12, the mechanical strength of the coupler 4 is improved. Since spaces are provided between the groups of fins 21, the refrigerant vapor flowing out from the vapor passages 8 can flow smoothly toward the connecting portion 13 without being disturbed by the fins 21.

Further, since the vapor passages 8 are separated by the section pillars 6a, the refrigerant vapor flows straight. Since the radiator 5 is made by stacking a plurality of radiator elements 23, it is easy to change radiation heat capacity according to requirement by increasing or decreasing the number of elements. Since the communication passage 11 is provided in the end cap 7, only the liquid refrigerant is supplied to the vapor passages 8 through the communication passage 11, thereby avoiding flow interference between the liquid and the vapor. Since the radiator 5 is mounted on the coupler 4 with a slope, the liquid refrigerant can easily flow from the flow-in chamber to the flow-out chamber.

Now, other embodiments of the present invention will be explained below.

Figure 5:
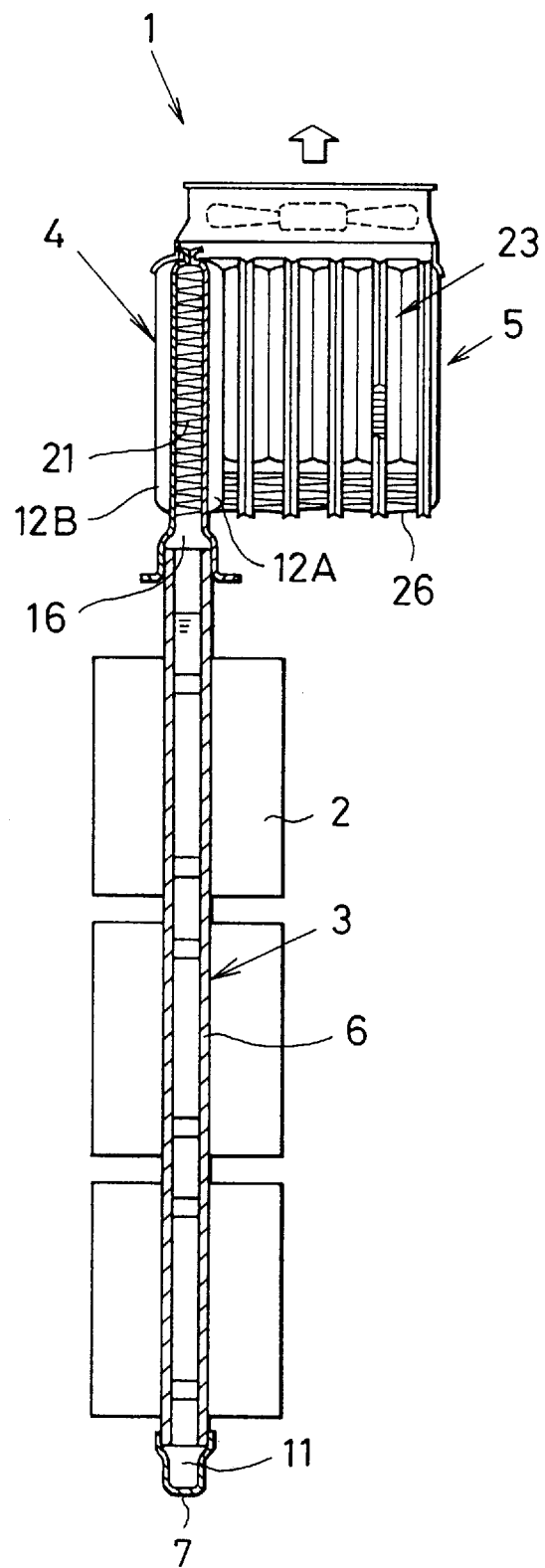
FIG. 5 is a side view of a cooling apparatus using a boiling and condensing refrigerant as a second embodiment of the present invention.

FIG. 5 shows a side view of a second embodiment of the present invention. In this embodiment, the radiator elements 23 are stacked on only one side of the coupler 4. A coupler plate 12A which is connected to the radiator 5 has holes to communicate with the radiator 5, and another radiator plate 14B is closed.

Figure 6:
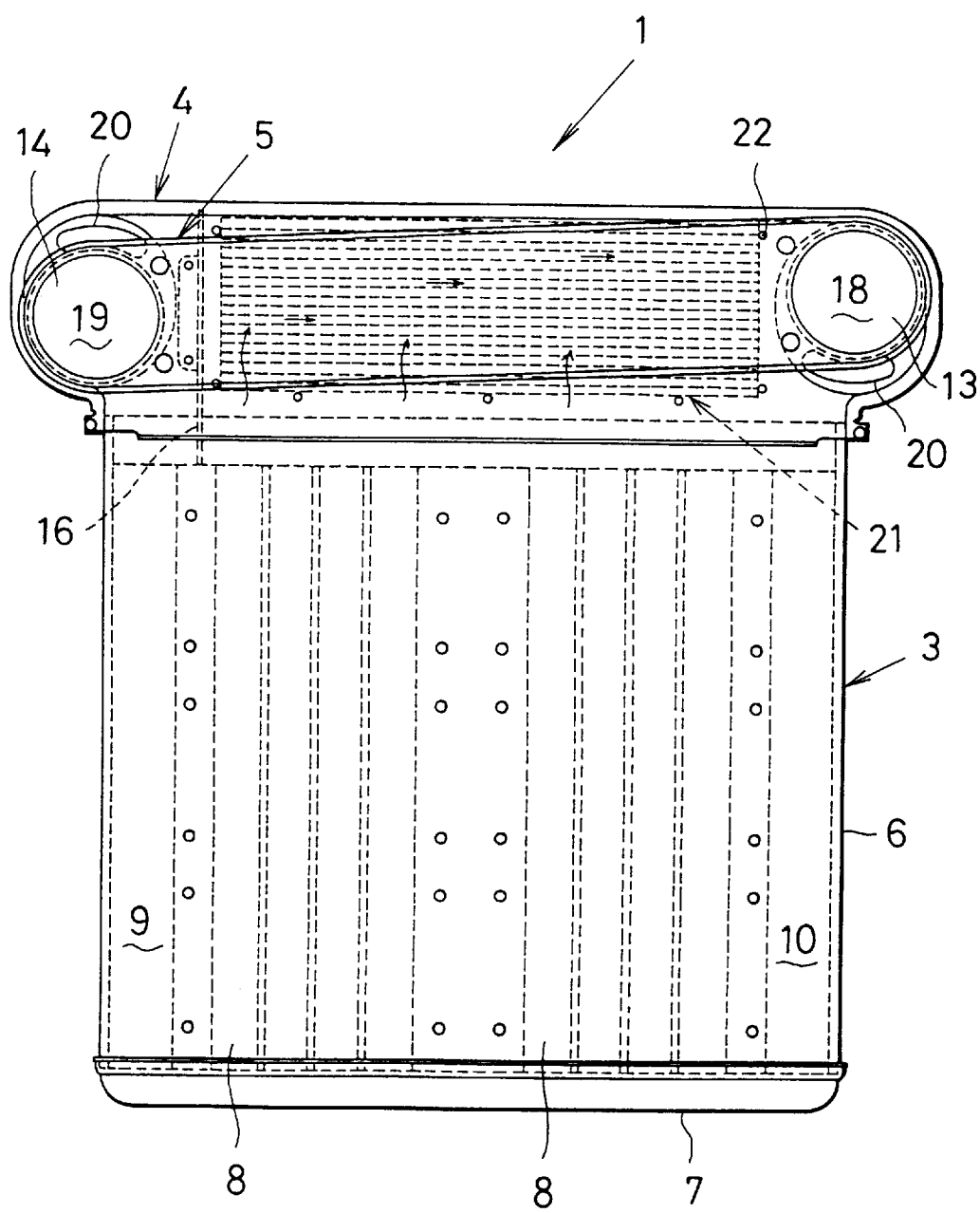
FIG. 6 is a front view of a cooling apparatus using a boiling and condensing refrigerant as a third embodiment of the present invention.
Figure 7:
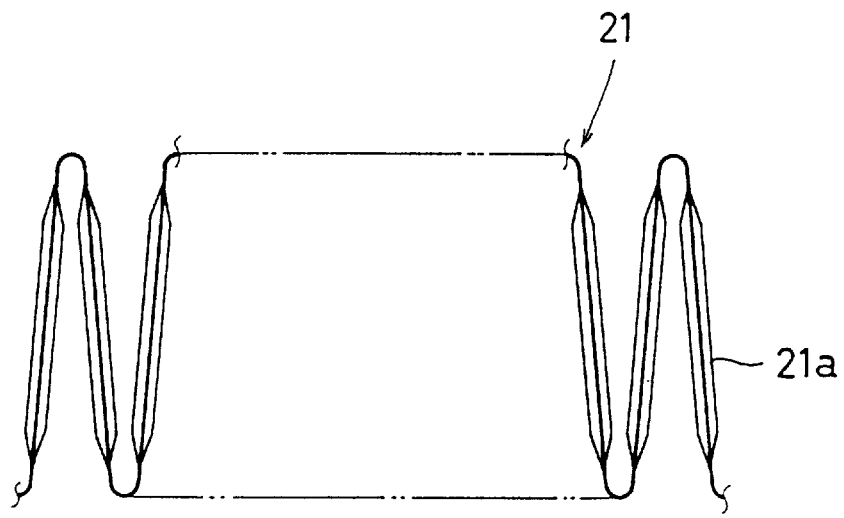
FIG. 7 is a partly enlarged side view of a radiator fin used in the third embodiment.
Figure 8:
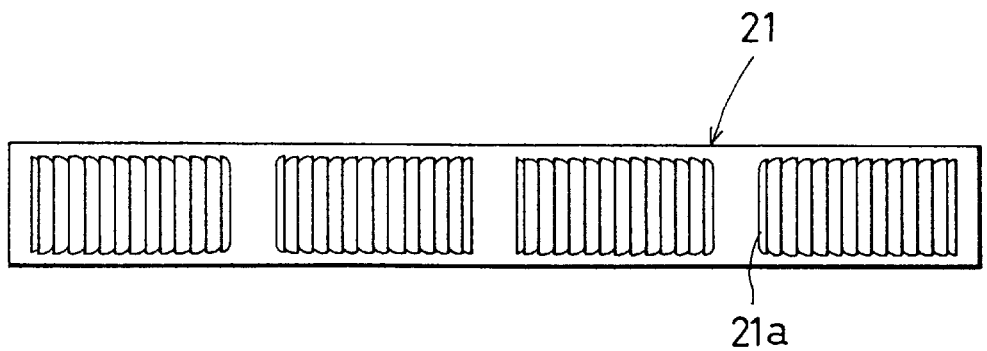
FIG. 8 is a front view of a radiator fin used in the third embodiment.

FIG. 6 shows a front view of a third embodiment of the present invention. In the third embodiment, the inner fins 21 inserted in the coupler 4 are not divided into groups. However, in order to provide passages for the refrigerant vapor coming up from the vapor passages 8, slits 21a are formed on the fin 21 as shown in FIGS. 7 and 8. The refrigerant vapor can go through the slits to the communicating portion 13. Since it is not necessary to divide the fins 21 into groups in this embodiment, assembly of the coupler 4 is simplified.

Figure 9:
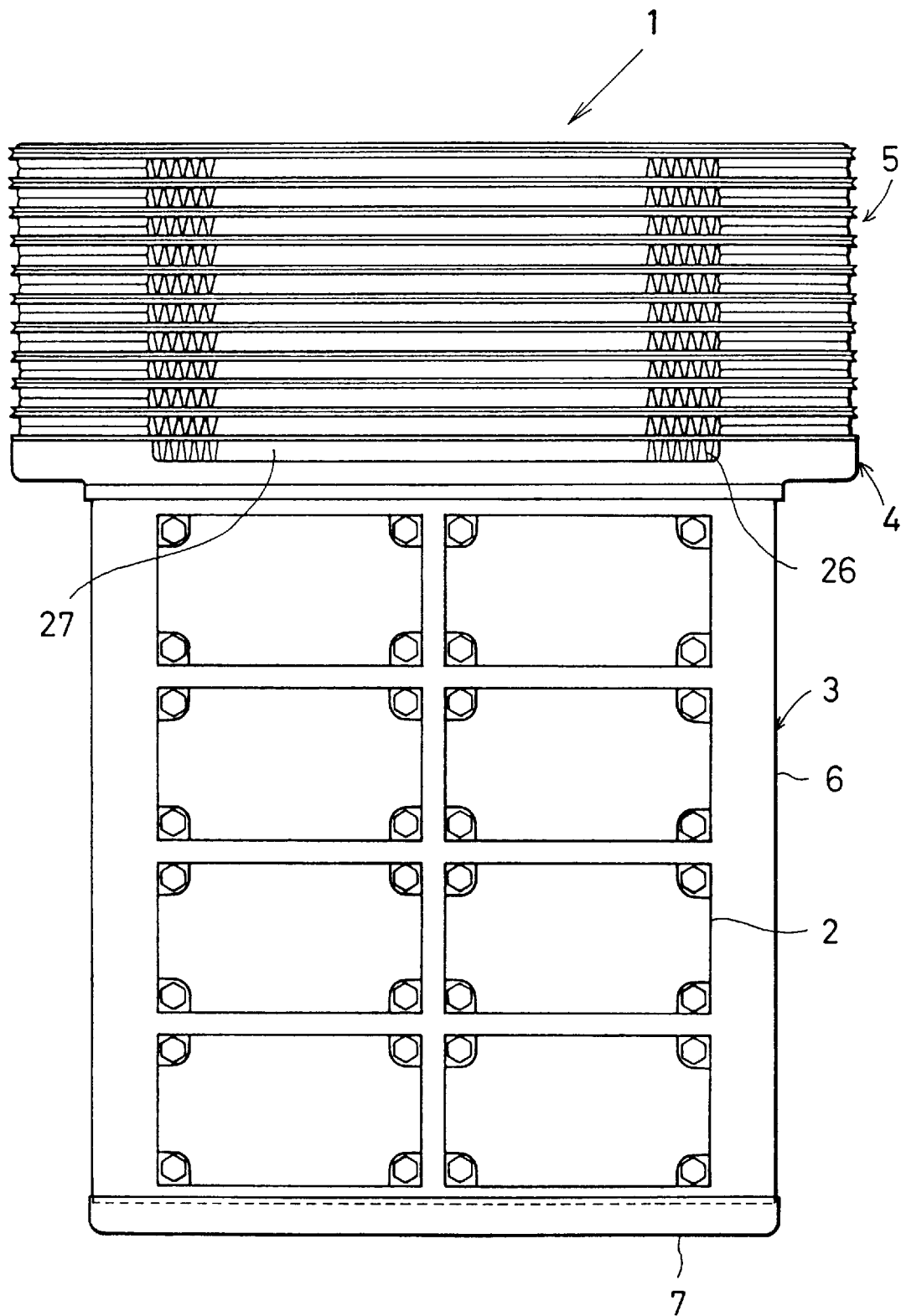
FIG. 9 is a front view of a cooling apparatus using a boiling and condensing refrigerant as a fourth embodiment of the present invention.
Figure 10:
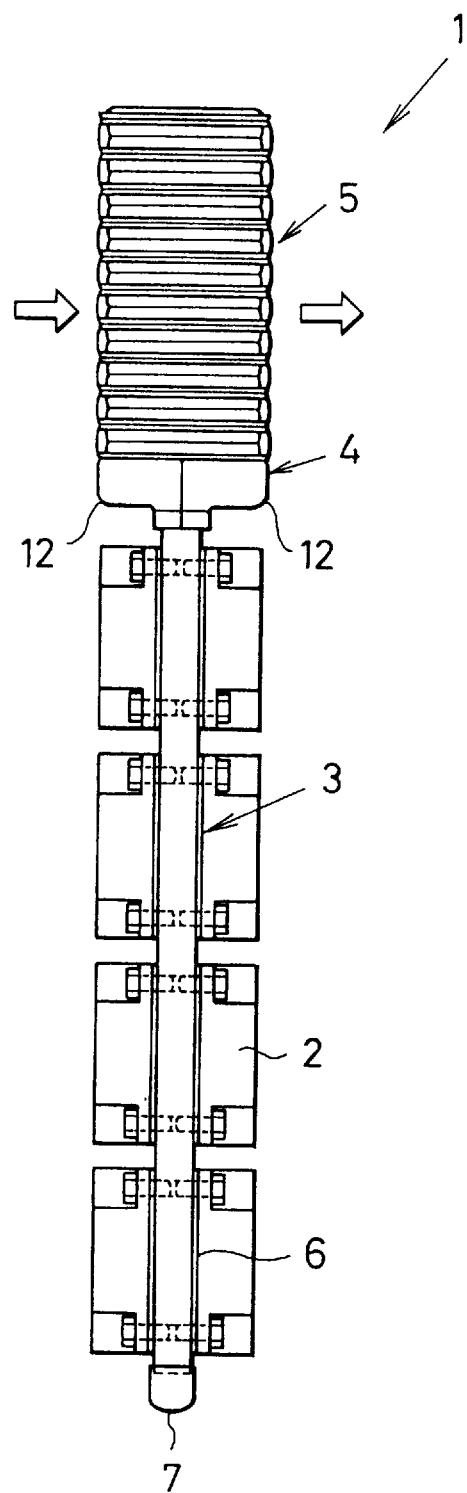
FIG. 10 is a side view of a cooling apparatus using a boiling and condensing refrigerant as the fourth embodiment of the present invention.

FIGS. 9 and 10 show a front view and a side view of a fourth embodiment of the present invention, respectively. In this embodiment, the radiator 5 is mounted on the coupler 4 in an upward direction as opposed to mounting the radiator 5 on the sides of the coupler 4 in the foregoing embodiments. Even in this arrangement, the coupler 4 can be composed of two parts bonded together. The air flow space 27 between the coupler 4 and the radiator 5 can be provided in this case, too. The radiating fins 26 are similarly provided in the air flow space 27, thus utilizing the coupler 4 as a part of the radiator.

Figure 11:
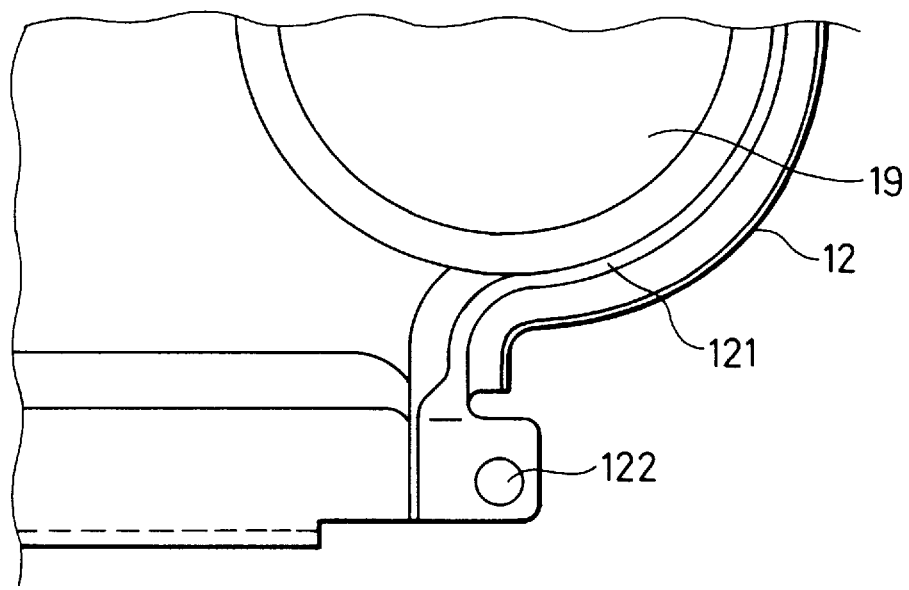
FIG. 11 is a partly enlarged plan view of the coupler plate shown in FIG. 4A.
Figure 12:
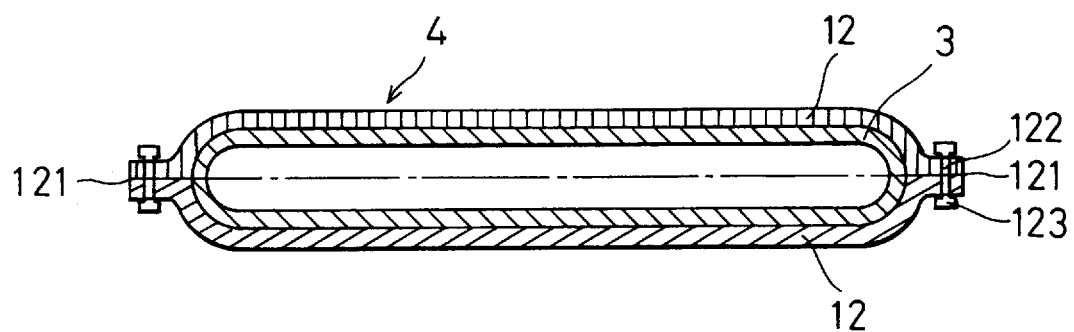
FIG. 12 is a cross-sectional view along a line XII—XII of FIG. 1, showing a way of connecting coupler plates.

Next, assembly of the coupler 4 of the present invention to the refrigerant tank 3 will be explained. As shown in FIG. 2, the upper end of the refrigerant tank 3 is inserted into the coupler 4. The coupler plate 12 shown in FIGS. 4A and 4B has two coupling holes 122 for coupling two coupler plates 12 together. FIG. 11 shows the coupling holes 122 of the coupler plate 12 shown in FIGS. 4A and 4B an enlarged scale. FIG. 12 is a cross-sectional view along a line XII—XII of FIG. 1, showing how the refrigerant tank 3 is inserted into the coupler 4 and how two coupler plates 12 are assembled before soldering process. As shown in FIG. 11, a connecting surface 121 of the coupler plate 12 is formed in a flange-shape thereon. The connecting hole 122 is formed on the connecting surface 121. As shown in FIG. 12, two coupler plates 12 are assembled by facing the connecting surfaces 121 made on both coupler plates 12, thereby making a space between the two plates. The two coupler plates 12 are fastened by screws or rivets 123 inserted into the connecting holes 122. Since the coupler plate 12 is made of a brazing plate clad with a solder material, the solder flows in the connecting holes 122 and on the connecting surface 121 when an assembled coupler is brazed in an oven.

Figure 13:
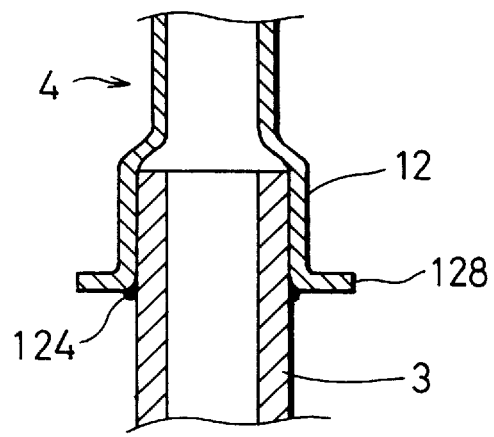
FIG. 13 is a partial cross-sectional view showing a portion connecting a coupler and a refrigerant tank of the first, second and third embodiments.

FIG. 13 is a fragmentary enlarged cross-section showing a connection between the coupler 4 and the refrigerant tank 3. As shown in the drawing, a flange 128 is formed around the outer periphery of the connection opening of the coupler 4. When the assembled cooling apparatus is brazed in the oven, the molten solder 124 stays at the connecting portion as shown in FIG. 13.

Figure 14:
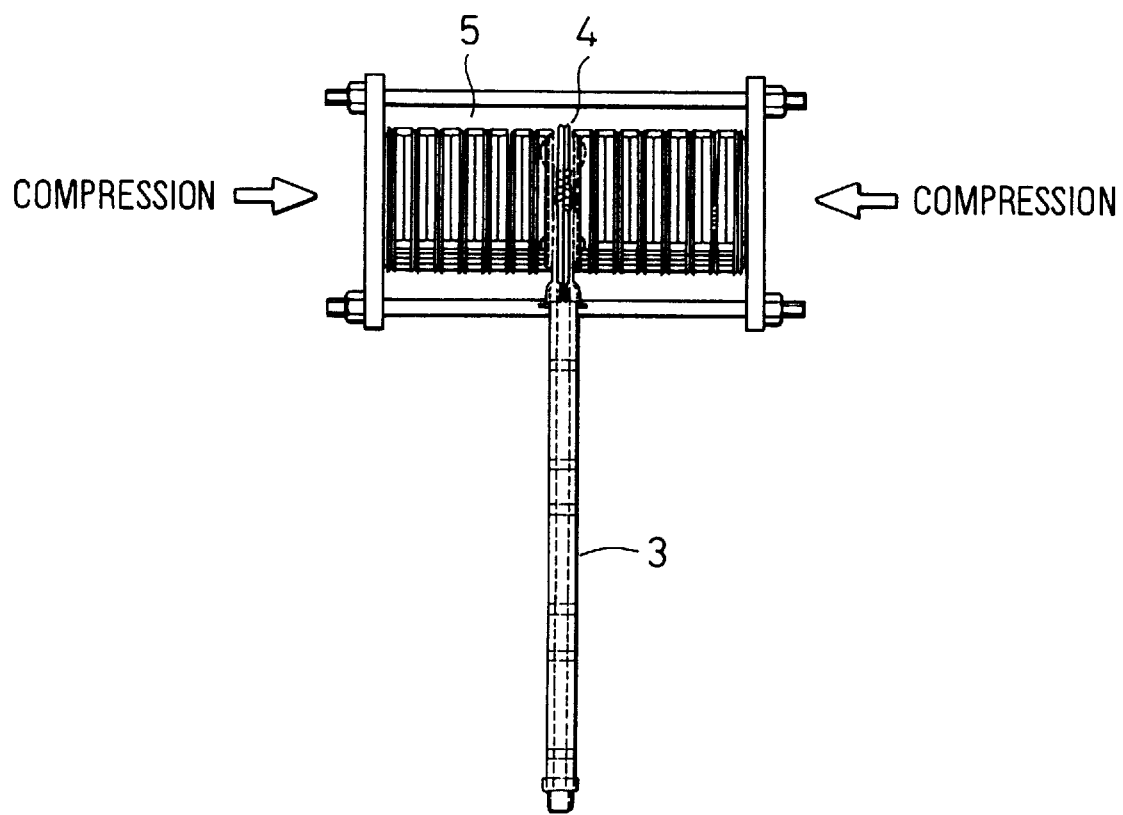
FIG. 14 is a drawing showing a manufacturing process of the first and third embodiments.
Figure 15:
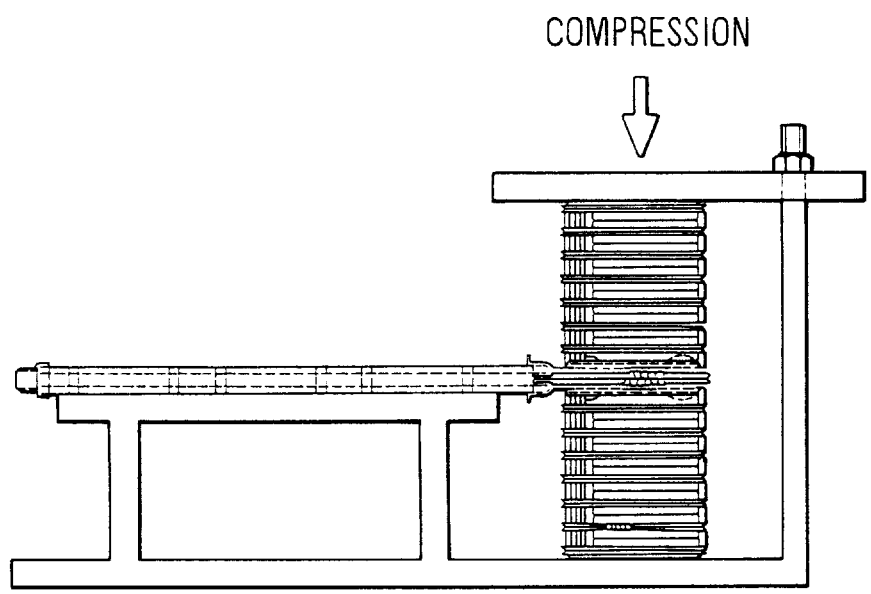
FIG. 15 is a drawing showing another manufacturing process of the first and third embodiments.

Now, Referring to FIGS. 14 and 15, examples of soldering methods in the brazing oven will be explained. After assembling the refrigerant tank 3, the coupler 4 and the radiator 5 composed of a plurality of the radiator elements 23, the radiator 5 is compressed by plates from both ends thereof. The plates compress each radiator element 23 together by means of bolts and nuts, for example, as shown in FIGS. 14 and 15. Then, two coupler plates 12 are fastened by screws or rivets 123 inserted into the connecting holes 122, as shown in FIG. 12. Then, the cooling assembly is put in the brazing oven and all the parts are bonded together by soldering. After the soldering process, the assembly is taken out from the oven and jigs such as the plates, bolts and nuts used for compressing the assembly are removed.

Since two coupler plates 12 are securely tightened by rivets or screws 123 inserted in the connecting holes 122 before the soldering process, the connecting surfaces of the coupler plates 12 are securely soldered, and accordingly air-tightness and reliability of the connected portion is greatly improved.

Figure 16:
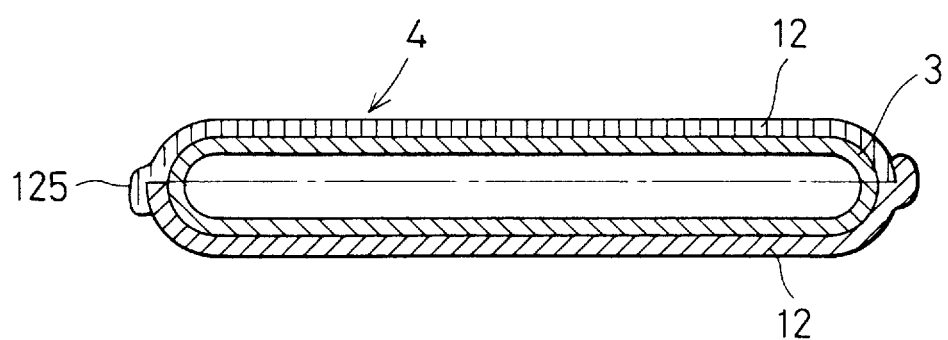
FIGS. 16, 17 and 18 are cross-sectional views, showing other modifications of FIG. 12.
Figure 17:
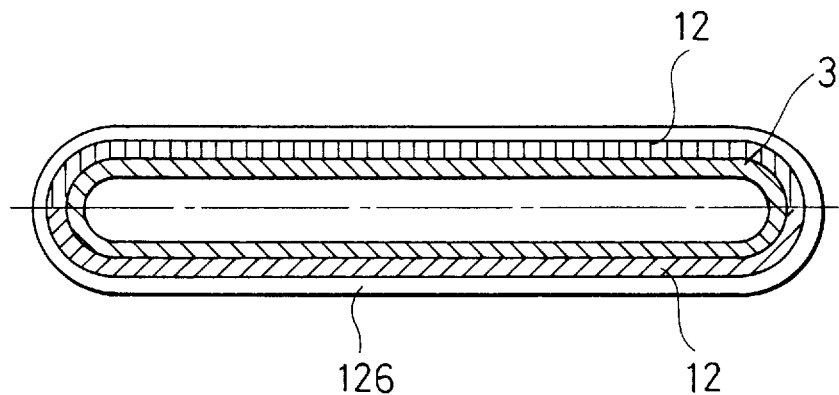
Figure 18:
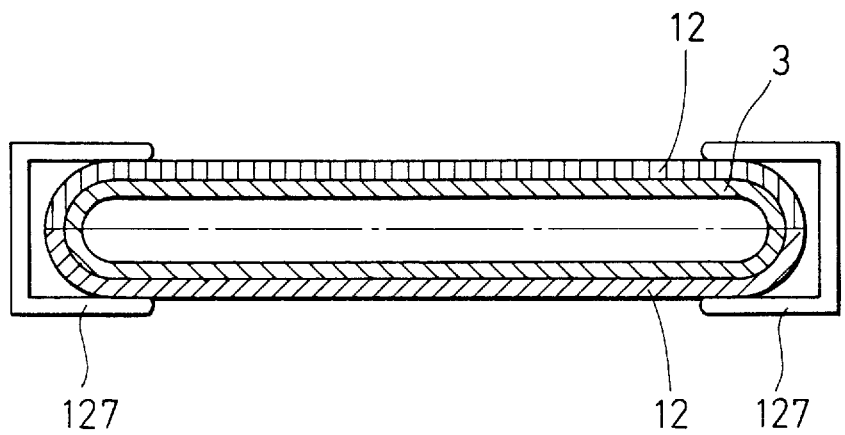

The way of connecting two coupler plates 12 shown in FIG. 12 can be modified in various forms. FIGS. 16, 17 and 18 show some modifications. In FIG. 9, two coupler plates 12 are connected by caulking, using caulking portions 125 formed on each coupler plate 12. In FIG. 17, a ring 126 encircles the outside of two coupler plates 12 for connecting two coupler plates 12. In FIG. 18, two coupler plates 12 are fastened together by clips 127. In using these modified ways of connection, the same results are attained as mentioned above.

Figure 19:
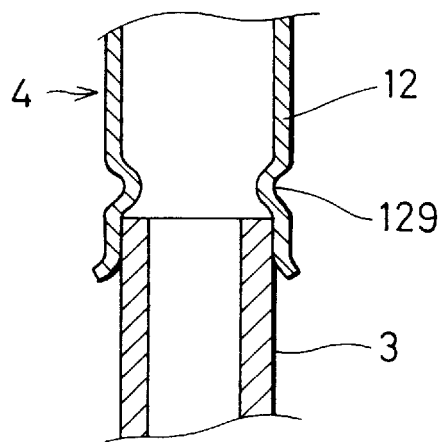
FIGS. 19 and 20 are cross-sectional views showing other modifications of FIG. 13.
Figure 20:
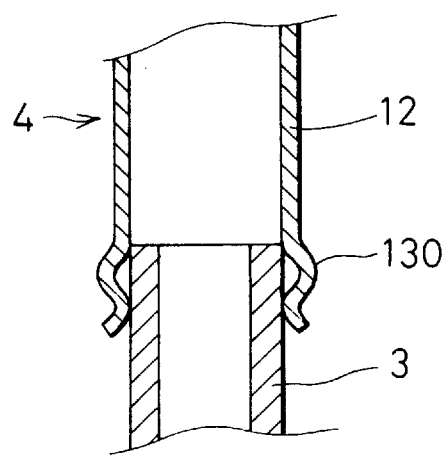

The connection of the coupler 4 and the refrigerant tank 3 shown in FIG. 13 can be modified in various forms. FIGS. 19 and 20 show examples of modifications. In FIG. 19, a depressed rib 129 is formed on the coupler plate 12 to fasten the coupler 4 tighter to the refrigerant tank 3. In FIG. 20, a sticking-out rib 130 is formed on the coupler plate 12 to fasten the coupler 4 tighter to the refrigerant tank 3. In using these modified connection, the same effects are obtained as in the connection shown in FIG. 13.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A cooling apparatus using a boiling and condensing refrigerant for cooling hot objects comprising:
   a refrigerant tank containing the boiling and condensing refrigerant therein on which the hot objects to be cooled are mounted, the refrigerant being vaporized, forming vaporized refrigerant, by heat received from the hot objects;
   a radiator for condensing the vaporized refrigerant by radiating heat away therefrom, the radiator comprising a plurality of radiator elements made of metallic plates stacked and bonded to one another; and
   a coupler connecting the refrigerant tank and the radiator, the coupler comprising a pair of coupler plates stacked on each other, in the same direction as the radiator elements are stacked, and bonded with the radiator elements.

2. A cooling apparatus using a boiling and condensing refrigerant according to claim 1, wherein a cooling air passage is provided between the radiator and the coupler.

3. A cooling apparatus using a boiling and condensing refrigerant according to claim 2, wherein radiating fins are installed in the cooling air passage.

4. A cooling apparatus using a boiling and condensing refrigerant according to claim 1, wherein the radiator is mounted on at least one side of the coupler.

5. A cooling apparatus using a boiling and condensing refrigerant according to claim 1, wherein:
   the refrigerant tank includes vapor passages into which the vaporized refrigerant flows, a liquid passage into which the refrigerant condensed in the radiator flows and a communication passage connecting the vapor passages and the liquid passage, and
   the coupler includes a first portion communicating with the vapor passages and the radiator, a second portion communicating with the liquid passage and the radiator, a divider plate dividing the first and second communicating portions, and inner fins inserted in the first communicating portion.

6. A cooling apparatus using a boiling and condensing refrigerant according to claim 5, wherein:
   the inner fins are inserted in a direction to allow the refrigerant to flow through the first communicating portion.

7. A cooling apparatus using a boiling and condensing refrigerant according to claim 1, comprising:
   means for connecting the pair of coupler plates.

8. A cooling apparatus using a boiling and condensing refrigerant according to claim 7, wherein the connecting means includes holes formed on the coupler plates and fastening means inserted into the holes.

9. A cooling apparatus using a boiling and condensing refrigerant according to claim 7, wherein the connecting means includes caulking portions formed on the coupler plates.

10. A cooling apparatus using a boiling and condensing refrigerant according to claim 7, wherein the connecting means includes a ring encircling the coupler plates.

11. A cooling apparatus using a boiling and condensing refrigerant according to claim 7, wherein the connecting means includes clips for joining the coupler plates.

12. A cooling apparatus using a boiling and condensing refrigerant according to claim 7, wherein the connecting means includes flanges made on the coupler plates by bending an end portion of the coupler plate outwardly.

13. A cooling apparatus using a boiling and condensing refrigerant according to claim 1, wherein:
   the refrigerant tank is inserted into an end of the coupler and bonded thereto; and
   the coupler is stacked and bonded with the radiator.

14. A cooling apparatus using a boiling and condensing refrigerant for cooling hot objects comprising:
   a refrigerant tank containing the boiling and condensing refrigerant therein on which the hot objects to be cooled are mounted, the refrigerant being vaporized, forming vaporized refrigerant, by heat received from the hot objects;
   a radiator for condensing the vaporized refrigerant by radiating heat away therefrom; and
   a coupler connecting the refrigerant tank and the radiator, the coupler comprising two coupler plates bonded together, wherein:
   the refrigerant tank includes vapor passages into which the vaporized refrigerant flows, a liquid passage into which the refrigerant condensed in the radiator flows and a communication passage connecting the vapor passages and the liquid passage; and
   the coupler includes a first portion communicating with the vapor passages and the radiator, a second portion communicating with the liquid passage and the radiator, a divider plate dividing the first and second communication portions, and inner fins inserted in the first communicating portion and arranged in a direction to allow the refrigerant to flow through the first communicating portion, the inner fins being divided into groups with a space therebetween.

15. A cooling apparatus using a boiling and condensing refrigerant for cooling hot objects comprising:
   a refrigerant tank containing the boiling and condensing refrigerant therein on which the hot objects to be cooled are mounted, the refrigerant being vaporized, forming vaporized refrigerant, by heat received from the hot objects;
   a radiator for condensing the vaporized refrigerant by radiating heat away therefrom; and
   a coupler connecting the refrigerant tank and the radiator, the coupler comprising two coupler plates bonded together, wherein:
   the refrigerant tank includes vapor passages into which the vaporized refrigerant flows, a liquid passage into which the refrigerant condensed in the radiator flows and a communication passage connecting the vapor passages and the liquid passage; and
   the coupler includes a first portion communicating with the vapor passages and the radiator, a second portion communicating with the liquid passage and the radiator, a divider plate dividing the first and second communicating portions, and inner fins inserted in the first communicating portion and arranged in a direction to allow the refrigerant to flow through the first communicating portion, the inner fins including slits formed thereon so that the vaporized refrigerant can pass through the slits.

16. A cooling apparatus using a boiling and condensing refrigerant for cooling hot objects comprising:
   a refrigerant tank containing the boiling and condensing refrigerant therein on which the hot objects to be cooled are mounted, the refrigerant being vaporized, forming vaporized refrigerant, by heat received from the hot objects;
   a radiator for condensing the vaporized refrigerant by radiating heat away therefrom; and a coupler connecting the refrigerant tank and the radiator, the coupler comprising two coupler plates bonded together, wherein:

the refrigerant tank includes vapor passages into which the vaporized refrigerant flows, a liquid passage into which the refrigerant condensed in the radiator flows and a communication passage connecting the vapor passages and the liquid passage;

the coupler includes a first portion communicating with the vapor passages and the radiator, a second portion communicating with the liquid passage and the radiator, a divider plate dividing the first and second communicating portions, and inner fins inserted in the first communicating portion; and the radiator is mounted on both sides of the coupler with an angle relative to a horizontal line so that the condensed refrigerant flows down through the radiator toward the liquid passage.

17. A cooling apparatus using a boiling and condensing refrigerant for cooling hot objects comprising:

a refrigerant tank containing the boiling and condensing refrigerant therein on which the hot objects to be cooled are mounted, the refrigerant being vaporized, forming vaporized refrigerant, by heat received from the hot objects;

a radiator for condensing the vaporized refrigerant by radiating heat away therefrom; and a coupler connecting the refrigerant tank and the radiator, wherein:

the refrigerant tank includes vapor passages into which the vaporized refrigerant flows, a liquid passage into which the refrigerant condensed in the radiator flows and a communication passage connecting the vapor passages and the liquid passage; and the coupler includes a first portion communicating with the vapor passages and the radiator, a second portion communicating with the liquid passage and the radiator, a divider plate dividing the first and second communicating portions, and inner fins inserted in the first communicating portion and arranged in a direction to allow the refrigerant to flow through the first communicating portion, the inner fins being divided into groups with a space therebetween.

18. A cooling apparatus using a boiling and condensing refrigerant for cooling hot objects comprising:

a refrigerant tank containing the boiling and condensing refrigerant therein on which the hot objects to be cooled are mounted, the refrigerant being vaporized, forming vaporized refrigerant, by heat received from the hot objects;

a radiator for condensing the vaporized refrigerant by radiating heat away therefrom; and a coupler connecting the refrigerant tank and the radiator, wherein:

the refrigerant tank includes vapor passages into which the vaporized refrigerant flows, a liquid passage into which the refrigerant condensed in the radiator flows and a communication passage connecting the vapor passages and the liquid passage; and the coupler includes a first portion communicating with the vapor passages and the radiator, a second portion communicating with the liquid passage and the radiator, a divider plate dividing the first and second communicating portions, and inner fins inserted in the first communicating portion and arranged in a direction to allow the refrigerant to flow through the first communicating portion, the inner fins including slits formed thereon so that the vaporized refrigerant can pass through the slits.

19. A cooling apparatus using a boiling and condensing refrigerant for cooling hot objects comprising:

a refrigerant tank containing the boiling and condensing refrigerant therein on which the hot objects to be cooled are mounted, the refrigerant being vaporized, forming vaporized refrigerant, by heat received from the hot objects;

a radiator for condensing the vaporized refrigerant by radiating heat away therefrom; and a coupler connecting the refrigerant tank and the radiator, wherein:

the refrigerant tank includes vapor passages into which the vaporized refrigerant flows, a liquid passage into which the refrigerant condensed in the radiator flows and a communication passage connecting the vapor passages and the liquid passage;

the coupler includes a first portion communicating with the vapor passages and the radiator, a second portion communicating with the liquid passage and the radiator, a divider plate dividing both first and second communicating portions, and inner fins inserted in the first communicating portion; and the radiator is mounted on both sides of the coupler with an angle relative to a horizontal line, so that the condensed refrigerant flows down through the radiator toward the liquid passage.

20. A cooling apparatus using a boiling and condensing refrigerant for cooling hot objects comprising:

a refrigerant tank containing the boiling and condensing refrigerant therein on which the hot objects to be cooled are mounted, the refrigerant being vaporized, forming vaporized refrigerant, by heat received from the hot objects;

a radiator for condensing the vaporized refrigerant by radiating heat away therefrom; and a coupler connecting the refrigerant tank and the radiator, wherein;

the refrigerant tank includes vapor passages into which the vaporized refrigerant flows, a liquid passage into which the refrigerant condensed in the radiator flows and a communication passage connecting the vapor passages and the liquid passage;

the coupler includes a first portion communicating with the vapor passages and the radiator, a second portion communicating with the liquid passage and the radiator, a divider plate dividing the first and second communicating portions, and inner fins inserted in the first communicating portion; and the refrigerant flows from the second communicating portion in the coupler, through the liquid passage and the vapor passages in the refrigerant tank, to the first communicating portion in the coupler.

* * * * *